(12) United States Patent
Lee et al.

(10) Patent No.: US 11,907,487 B2
(45) Date of Patent: Feb. 20, 2024

(54) TOUCH PANEL AND DISPLAY DEVICE INCLUDING THE SAME

(71) Applicant: Samsung Display Co., LTD., Yongin-si (KR)

(72) Inventors: Sun-Hwa Lee, Yongin-si (KR); Dong-Hoon Lee, Hwaseong-si (KR); Mu-Kyung Jeon, Ulsan (KR); Ki-Hyun Pyo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 67 days.

(21) Appl. No.: 17/616,194

(22) PCT Filed: Nov. 29, 2019

(86) PCT No.: PCT/KR2019/016707
§ 371 (c)(1),
(2) Date: Dec. 3, 2021

(87) PCT Pub. No.: WO2020/246673
PCT Pub. Date: Dec. 10, 2020

(65) Prior Publication Data
US 2022/0334679 A1    Oct. 20, 2022

(30) Foreign Application Priority Data

Jun. 7, 2019    (KR) ........................ 10-2019-0067103

(51) Int. Cl.
*G06F 3/044*    (2006.01)
*G06F 3/041*    (2006.01)

(52) U.S. Cl.
CPC .......... *G06F 3/0446* (2019.05); *G06F 3/0443* (2019.05); *G06F 3/04164* (2019.05); *G06F 3/04166* (2019.05)

(58) Field of Classification Search
CPC ............... G06F 3/0446; G06F 3/04164; G06F 3/04166; G06F 3/0443; G06F 2203/04103;
(Continued)

(56) References Cited

U.S. PATENT DOCUMENTS 8,730,132 B2 * 5/2014 Choi .................... G09G 3/3233
345/76
8,970,524 B2    3/2015 Kim et al.
(Continued)

FOREIGN PATENT DOCUMENTS

CN    103197819    7/2013
CN    105975129    9/2016
(Continued)

OTHER PUBLICATIONS

Korean Office Action dated Jan. 18, 2023, in Korean Patent Application No. 10-2019-0067103.
(Continued)

*Primary Examiner* — Amy Onyekaba
(74) *Attorney, Agent, or Firm* — H.C. Park & Associates, PLC (57) ABSTRACT

A touch panel includes odd-numbered touch sensor rows, even-numbered touch sensor rows, odd-numbered sensing signal transmission lines extending respectively connected to the odd-numbered touch sensor rows, and even-numbered sensing signal transmission lines respectively connected to the even-numbered touch sensor rows. First sub-scan signal transmission lines are connected only to the odd-numbered touch sensor rows, and second sub-scan signal transmission lines are connected only to the even-numbered touch sensor rows. Main scan signal transmission lines are connected to a demultiplexing circuit to selectively connect the main scan signal transmission lines to the first sub-scan signal trans-
(Continued)

mission lines or the second sub-scan signal transmission lines.

17 Claims, 4 Drawing Sheets (58) Field of Classification Search
CPC ....... G06F 3/0412; G06F 3/044; H10K 59/40; H10K 50/84
See application file for complete search history.

(56) References Cited

U.S. PATENT DOCUMENTS

| | | | |
|---|---|---|---|
| 9,231,034 B1* | 1/2016 | Chen | ................ H10K 59/38 |
| 9,342,178 B2 | 5/2016 | Lee et al. | |
| 9,851,831 B2 | 12/2017 | Wang | |
| 10,162,458 B2 | 12/2018 | Kwon et al. | |
| 10,324,570 B2 | 6/2019 | Kimura et al. | |
| 10,732,779 B2* | 8/2020 | Mugiraneza | ......... G06F 3/0412 |
| 2012/0262384 A1* | 10/2012 | Kim | ................ G06F 3/04184 |
| | | | 345/173 |
| 2014/0306906 A1* | 10/2014 | Huang | ................ G06F 3/045 |
| | | | 345/173 |
| 2015/0061983 A1* | 3/2015 | Kim | ................ G09G 3/3275 |
| | | | 345/82 |
| 2015/0145843 A1* | 5/2015 | Park | ................ G09G 3/20 |
| | | | 345/209 |
| 2016/0014402 A1* | 1/2016 | Lee | ................ H04N 13/398 |
| | | | 348/51 |
| 2016/0098126 A1* | 4/2016 | Lee | ................ G06F 3/0443 |
| | | | 345/174 |
| 2016/0182901 A1* | 6/2016 | Lee | ................ H04N 13/341 |
| | | | 345/691 |
| 2016/0358525 A1* | 12/2016 | Huang | ................ G06F 3/0445 |
| 2017/0076665 A1* | 3/2017 | Kim | ................ G09G 3/3225 |
| 2017/0090630 A1* | 3/2017 | Kim | ................ G06F 3/0443 |
| 2018/0059868 A1* | 3/2018 | Brahma | ................ G09G 3/2022 |
| 2018/0284926 A1* | 10/2018 | Kim | ................ G06F 3/04166 |
| 2018/0364857 A1* | 12/2018 | Lai | ................ G06F 3/04166 |
| 2019/0171319 A1* | 6/2019 | Aoki | ................ G06F 3/044 |
| 2019/0189059 A1* | 6/2019 | Na | ................ G09G 3/3225 |
| 2020/0218420 A1* | 7/2020 | Feng | ................ G06F 3/04166 |
| 2020/0343313 A1 | 10/2020 | Lee et al. | |
| 2021/0365143 A1* | 11/2021 | Long | ................ G09G 3/006 |

FOREIGN PATENT DOCUMENTS

| | | |
|---|---|---|
| CN | 206248953 | 6/2017 |
| CN | 107562272 | 1/2018 |
| JP | 2017-130200 | 7/2017 |
| JP | 2019-074869 | 5/2019 |
| KR | 10-2013-0015582 | 2/2013 |
| KR | 10-2016-0019625 | 2/2016 |
| KR | 10-2016-0094577 | 8/2016 |
| KR | 10-2016-0094628 | 8/2016 |
| KR | 10-2017-0015810 | 2/2017 |
| KR | 10-2017-0016556 | 2/2017 |
| KR | 10-2018-0044491 | 5/2018 |
| KR | 10-2018-0069280 | 6/2018 |
| KR | 10-2019-0045574 | 5/2019 |

OTHER PUBLICATIONS

U.S. Appl. No. 10/540,029, filed Jan. 21, 2020, Shim et al.
Notice of Allowance dated Jul. 12, 2023, in Korean Patent Application No. 10-2019-0067103.
Office Action issued from the Chinese Patent Office dated Sep. 23, 2023 for Chinese Patent Application No. 201980097263.X.

* cited by examiner

TOUCH PANEL AND DISPLAY DEVICE INCLUDING THE SAME

CROSS REFERENCE TO RELATED APPLICATION

This application is a National Stage Entry of International Application No. PCT/KR2019/016707, filed on Nov. 29, 2019, and claims priority from and the benefit of Korean Patent Application No. 10-2019-0067103, filed on Jun. 7, 2019, each of which is hereby incorporated by reference for all purposes as if fully set forth herein.

BACKGROUND

Field

Embodiments of the invention relate generally to a touch panel and a display device including the touch panel.

Discussion of the Background

As an input device of a display device, a touch panel is replacing a mouse or a keyboard, and recently, a capacitive method (e.g., a mutual capacitance method or a self-capacitance method) touch panel has been attracting attention.

Such a touch panel is divided into an external structure and a built-in structure according to a structure disposed on the display device, and the built-in structure is further divided into an on-cell structure and an in-cell structure. Among the built-in structures, since the on-cell structure is a structure in which a touch sensor is embedded in the upper portion of the display panel and is manufactured to have a thin thickness, the on-cell structure may facilitate implementation of a rollable display device, a foldable display device, a flexible display device, and the like.

Recently, as the size of a display device has gradually increased, the application of a touch panel is required not only in a small display device but also in a medium-sized display device. In order to apply the touch panel to the medium-sized display device, it is also necessary to increase the size of the touch panel. As the size of the touch panel increases, the number of touch sensors arranged on the touch panel increases, and the number and length of lines connected to the touch sensors increase. Accordingly, the line resistance of the line through which the scan signal is transmitted may increase, and accordingly, a signal-to-noise ratio ("SNR") of the scan signal may be reduced.

The above information disclosed in this Background section is only for understanding of the background of the inventive concepts, and, therefore, it may contain information that does not constitute prior art.

SUMMARY

An object of the present invention is to provide a touch panel that can improve the signal-to-noise ratio of the scan signal by reducing the line resistance of the line through which the scan signal is transmitted.

An object of the present invention is to provide a display device including the touch panel.

Additional features of the inventive concepts will be set forth in the description which follows, and in part will be apparent from the description, or may be learned by practice of the inventive concepts.

In order to achieve the object of the present invention described above, a touch panel according to embodiments may include odd-numbered touch sensor rows corresponding to odd-numbered rows, even-numbered touch sensor rows corresponding to even-numbered rows, odd-numbered sensing signal transmission lines extending in a row direction, arranged side by side in a column direction, and respectively connected to the odd-numbered touch sensor rows, even-numbered sensing signal transmission lines extending in the row direction, arranged side by side in the column direction, and respectively connected to the even-numbered touch sensor rows, first sub-scan signal transmission lines extending in the column direction, arranged side by side in the row direction, and connected only to the odd-numbered touch sensor rows, second sub-scan signal transmission lines extending in the column direction, arranged side by side in the row direction, and connected only to the even-numbered touch sensor rows, main scan signal transmission lines extending in the column direction and arranged side by side in the row direction, and a demultiplexing circuit selectively connecting the main scan signal transmission lines to the first sub-scan signal transmission lines or the second sub-scan signal transmission lines.

In an embodiment, the demultiplexing circuit may include first switches located between the main scan signal transmission lines and the first sub-scan signal transmission lines, turned on when a first control signal is activated, and turned off when the first control signal is deactivated and second switches located between the main scan signal transmission lines and the second sub-scan signal transmission lines, turned on when a second control signal is activated, and turned off when the second control signal is deactivated.

In an embodiment, one frame may include a first sub-frame and a second sub-frame which are sequentially implemented.

In an embodiment, the demultiplexing circuit may connect the main scan signal transmission lines to the first sub-scan signal transmission lines during the first sub-frame, and the demultiplexing circuit may connect the main scan signal transmission lines to the second sub-scan signal transmission lines during the second sub-frame.

In an embodiment, the first control signal may be activated and the second control signal is deactivated in the first sub-frame, and the first control signal may be deactivated and the second control signal is activated in the second sub-frame.

In an embodiment, one frame may include first to n-th (where n is an integer greater than or equal to 3) sub-frames sequentially implemented, and each of the first to n-th sub-frames may include a first period and a second period following the first period.

In an embodiment, the demultiplexing circuit may connect the main scan signal transmission lines to the first sub-scan signal transmission lines during the first period, and the demultiplexing circuit may connect the main scan signal transmission lines to the second sub-scan signal transmission lines during the second period.

In an embodiment, the first control signal may be activated and the second control signal is deactivated in the first period, and the first control signal may be deactivated and the second control signal is activated in the second period.

In an embodiment, the touch panel may further include a scan signal transmission circuit connected to the main scan signal transmission lines and sequentially transmitting scan signals to the main scan signal transmission lines, a sensing signal receiving circuit connected to the odd-numbered sensing signal transmission lines and the even-numbered sensing signal transmission lines and configured to be receive sensing signals corresponding to the scan signals from the odd-numbered sensing signal transmission lines and the even-numbered sensing signal transmission lines, and a control circuit configured to detect a touch position based on the sensing signals and configured to control the scan signal transmission circuit, the sensing signal receiving circuit, and the demultiplexing circuit.

In order to achieve the object of the present invention described above, a display device according to embodiments may include a display panel configured to display images and a touch panel including a plurality of touch sensors disposed on a thin film encapsulation layer included in the display panel and configured to detect a touch position using the touch sensors. The touch panel may include odd-numbered touch sensor rows corresponding to odd-numbered rows, even-numbered touch sensor rows corresponding to even-numbered rows, odd-numbered sensing signal transmission lines extending in a row direction, arranged side by side in a column direction, and respectively connected to the odd-numbered touch sensor rows, even-numbered sensing signal transmission lines extending in the row direction, arranged side by side in the column direction, and respectively connected to the even-numbered touch sensor rows, first sub-scan signal transmission lines extending in the column direction, arranged side by side in the row direction, and connected only to the odd-numbered touch sensor rows, second sub-scan signal transmission lines extending in the column direction, arranged side by side in the row direction, and connected only to the even-numbered touch sensor rows, main scan signal transmission lines extending in the column direction and arranged side by side in the row direction, and a demultiplexing circuit selectively connecting the main scan signal transmission lines to the first sub-scan signal transmission lines or the second sub-scan signal transmission lines.

In an embodiment, the display panel may include a substrate, a transistor layer disposed on the substrate and including at least one transistor, an emission layer disposed on the transistor layer and including at least one emitting diode, and the thin film encapsulation layer disposed on the emission layer and covering the emitting diode.

In an embodiment, the demultiplexing circuit may be formed in the transistor layer.

In an embodiment, the demultiplexing circuit may include first switches located between the main scan signal transmission lines and the first sub-scan signal transmission lines, turned on when a first control signal is activated, and turned off when the first control signal is deactivated and second switches located between the main scan signal transmission lines and the second sub-scan signal transmission lines, turned on when a second control signal is activated, and turned off when the second control signal is deactivated.

In an embodiment, one frame may include a first sub-frame and a second sub-frame which are sequentially implemented.

In an embodiment, the demultiplexing circuit may connect the main scan signal transmission lines to the first sub-scan signal transmission lines during the first sub-frame, and the demultiplexing circuit may connect the main scan signal transmission lines to the second sub-scan signal transmission lines during the second sub-frame.

In an embodiment, the first control signal may be activated and the second control signal is deactivated in the first sub-frame, and the first control signal may be deactivated and the second control signal is activated in the second sub-frame.

In an embodiment, one frame may include first to n-th (where n is an integer greater than or equal to 3) sub-frames sequentially implemented, and each of the first to n-th sub-frames may include a first period and a second period following the first period.

In an embodiment, the demultiplexing circuit may connect the main scan signal transmission lines to the first sub-scan signal transmission lines during the first period, and the demultiplexing circuit may connect the main scan signal transmission lines to the second sub-scan signal transmission lines during the second period.

In an embodiment, the first control signal may be activated and the second control signal is deactivated in the first period, and the first control signal may be deactivated and the second control signal is activated in the second period.

In an embodiment, the touch panel may further include a scan signal transmission circuit connected to the main scan signal transmission lines and sequentially transmitting scan signals to the main scan signal transmission lines, a sensing signal receiving circuit connected to the odd-numbered sensing signal transmission lines and the even-numbered sensing signal transmission lines and configured to be receive sensing signals corresponding to the scan signals from the odd-numbered sensing signal transmission lines and the even-numbered sensing signal transmission lines, and a control circuit configured to detect a touch position based on the sensing signals and configured to control the scan signal transmission circuit, the sensing signal receiving circuit, and the demultiplexing circuit.

Since the touch panel according to embodiments of the present invention includes the odd-numbered touch sensor rows corresponding to the odd-numbered rows, the even-numbered touch sensor rows corresponding to the even-numbered rows, the odd-numbered sensing signal transmission lines extending in the row direction, arranged side by side in the column direction, and respectively connected to the odd-numbered touch sensor rows, the even-numbered sensing signal transmission lines extending in the row direction, arranged side by side in the column direction, and respectively connected to the even-numbered touch sensor rows, the first sub-scan signal transmission lines extending in the column direction, arranged side by side in the row direction, and connected only to the odd-numbered touch sensor rows, the second sub-scan signal transmission lines extending in the column direction, arranged side by side in the row direction, and connected only to the even-numbered touch sensor rows, the main scan signal transmission lines extending in the column direction and arranged side by side in the row direction, and the demultiplexing circuit selectively connecting the main scan signal transmission lines to the first sub-scan signal transmission lines or the second sub-scan signal transmission lines, the main scan transmission lines may be alternately connected to odd-numbered touch sensor rows and even-numbered touch sensor rows during one frame. As a result, the touch panel may reduce the line resistance of the line through which the scan signal is transmitted, thereby improving the signal-to-noise ratio of the scan signal.

By including the touch panel, the display device according to embodiments of the present invention may provide a user with high-quality touch sensitivity.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, display devices and methods of manufacturing display devices in accordance with embodiments of the present invention will be explained in detail with reference to the accompanying drawings.

Figure 1:
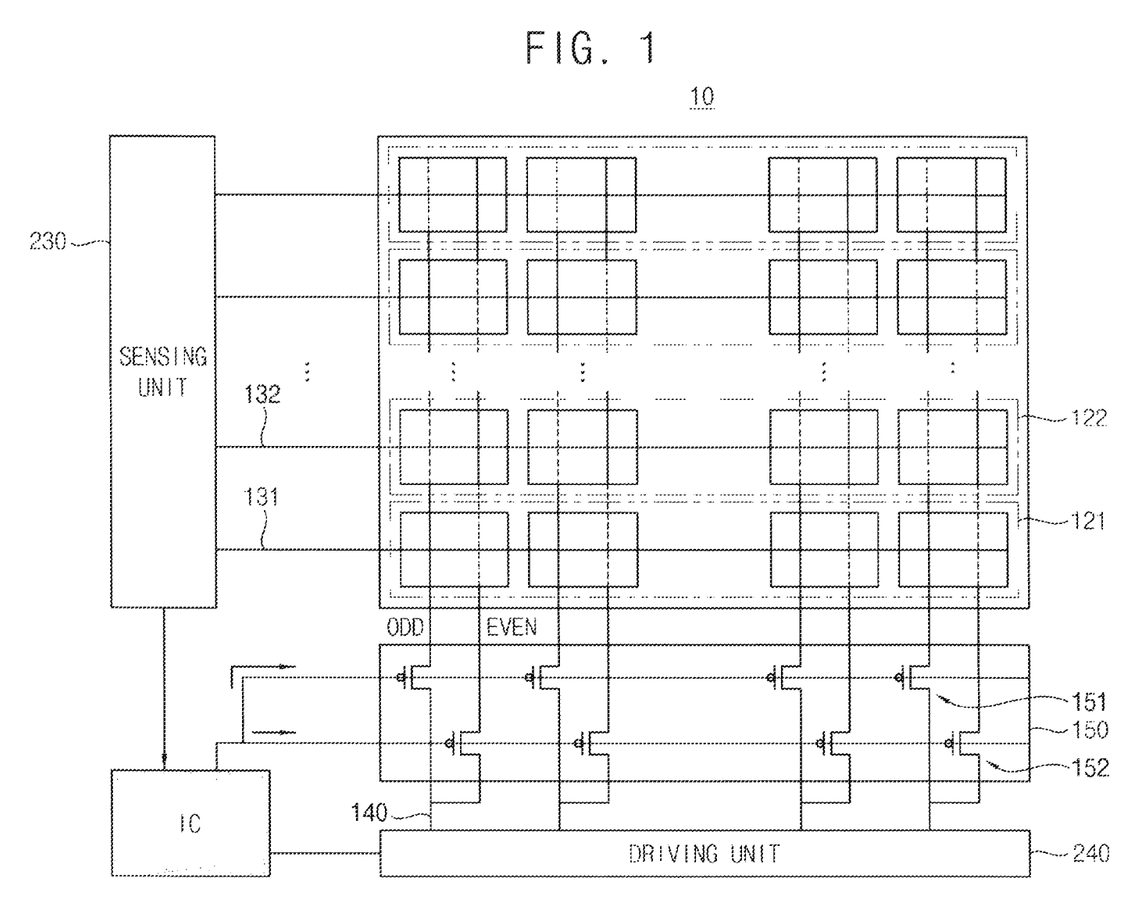
FIG. 1 is a diagram illustrating a touch panel according to embodiments of the present invention.

FIG. 1 is a diagram illustrating a touch panel according to embodiments of the present invention.

Referring to FIG. 1, a touch panel 10 may include odd-numbered touch sensor rows 121, even-numbered touch sensor rows 122, odd-numbered sensing signal transmission lines 131, even-numbered sensing signal transmission lines 132, first sub-scan signal transmission lines (odd), second sub-scan signal transmission lines (even), main scan signal transmission lines 140, and a demultiplexing circuit 150.

In detail, the touch panel 10 may include touch sensors. The touch sensors may be divided into the odd-numbered touch sensor rows 121 corresponding to odd-numbered rows and the even-numbered touch sensor rows 122 corresponding to even-numbered rows. For example, touch sensors positioned in one odd-numbered row may constitute one odd-numbered touch sensor row 121, and touch sensors positioned in one even-numbered row may constitute one even-numbered touch sensor row 122. The odd-numbered touch sensor rows 121 may be respectively connected to the odd-numbered sensing signal transmission lines 131. In addition, the odd-numbered touch sensor rows 121 may be connected to the first sub-scan signal transmission lines (odd) and may not be connected to the second sub-scan signal transmission lines (even). The even-numbered touch sensor rows 122 may be respectively connected to the even-numbered sensing signal transmission lines 132. In addition, the even-numbered touch sensor rows 122 may be connected to the second sub-scan signal transmission lines (even) and may not be connected to the first sub-scan signal transmission lines (odd). Each of the touch sensors may include touch electrodes, and mutual capacitance may be formed between the touch electrodes. Meanwhile, the touch electrodes may be formed of conductive electrode materials such as indium tin oxide, carbon nanotube, graphene, conductive polymer transparent conductive oxide, and metal nanowire. However, the conductive electrode materials of the touch electrodes are not limited thereto.

In an embodiment, since the first sub-scan signal transmission line (odd) bypasses the touch sensor through a patterning shape of the touch electrode included in the touch sensor, the touch sensor and the first sub-scan signal transmission line (odd) may not be connected to each other, and since the second sub-scan signal transmission line (even) bypasses the touch sensor through a patterning shape of the touch electrode included in the touch sensor, the touch sensor and the second sub-scan signal transmission line (even) may not be connected to each other. A patterning process for forming the patterning shape of the touch electrode may include a printing process such as a screen printing method or gravure off-set printing method, imprinting method, or photolithography method, but the patterning process is not limited thereto. In this way, by utilizing the patterning shape of the touch electrode included in the touch sensor, the odd-numbered touch sensor row 121 may not be connected to the second sub-scan signal transmission line (even) and the even-numbered touch sensor row 122 may not be connected to the first sub-scan signal transmission line (odd). In an embodiment, the patterning shape of the touch electrode included in the touch sensor may be formed in a mesh structure (i.e., a structure in which a network shape is formed in the touch electrode included in the touch sensor).

The odd-numbered sensing signal transmission lines 131 may extend in a row direction and may be arranged side by side in a column direction. The odd-numbered sensing signal transmission lines 131 may be respectively connected to the odd-numbered touch sensor rows 121. The even-numbered sensing signal transmission lines 132 may extend in the row direction and may be arranged side by side in the column direction. The even-numbered sensing signal transmission lines 132 may be respectively connected to the even-numbered touch sensor rows 122. That is, as shown in FIG. 1, the odd-numbered sensing signal transmission lines 131 and the even-numbered sensing signal transmission lines 132 may be alternately disposed in the column direction. The odd-numbered sensing signal transmission lines 131 may transmit a sensing signal sensing a change in capacitance formed in the odd-numbered touch sensor rows 121 to the sensing signal receiving circuit 230. Likewise, the even-numbered sensing signal transmission lines 132 may transmit a sensing signal sensing a change in capacitance formed in the even-numbered touch sensor rows 122 to the sensing signal receiving circuit 230. The sensing signal receiving circuit 230 may be connected to a control circuit IC, and the control circuit IC may detect whether the touch panel 10 is touched and the touch position based on the sensing signals.

The first sub-scan signal transmission lines (odd) may extend in the column direction and may be arranged side by side in the row direction. As described above, the first sub-scan signal transmission lines (odd) may be connected only to the odd-numbered touch sensor rows 121 and may not be connected to the even-numbered touch sensor rows 122. The second sub-scan signal transmission lines (even) may extend in the column direction and may be arranged side by side in the row direction. As described above, the second sub-scan signal transmission lines (even) may be connected only to the even-numbered touch sensor rows 122 and may not be connected to the odd-numbered touch sensor rows 121. That is, as shown in FIG. 1, the first sub-scan signal transmission lines (odd) and the second sub-scan signal transmission lines (even) may be alternately disposed in the row direction. Meanwhile, for convenience of explanation, the first sub-scan signal transmission lines (odd) are shown as solid lines in odd-numbered touch sensor rows 121 to which the first sub-scan signal transmission lines (odd) are connected, and the first sub-scan signal transmission lines (odd) are shown as dotted lines in even-numbered touch sensor rows 122 to which the first sub-scan signal transmission lines (odd) are not connected in FIG. 1. Likewise, the second sub-scan signal transmission lines (even) are shown as solid lines in even-numbered touch sensor rows 122 to which the second sub-scan signal transmission lines (even) are connected, and the second sub-scan signal transmission lines (even) are shown as dotted lines in odd-numbered touch sensor rows 121 to which the second sub-scan signal transmission lines (even) are not connected in FIG. 1.

The first sub-scan signal transmission lines (odd) may be connected to the main scan signal transmission lines 140 through the demultiplexing circuit 150, and may receive a scan signal from a scan signal transmission circuit 240 to apply the scan signal to the odd-numbered touch sensor rows 121. Since the first sub-scan signal transmission lines (odd) are connected to the odd-numbered touch sensor rows 121, the first sub-scan signal transmission lines (odd) may serve as a driving signal line for applying the scan signal to the odd-numbered touch sensor rows 121. That is, the first sub-scan signal transmission lines (odd) may apply the scan signal to the odd-numbered touch sensor rows 121 connected to the first sub-scan signal transmission lines (odd), and the touch sensors constituting the odd-numbered touch sensor rows 121 may generate the sensing signal based on the scan signal. On the other hand, since the first sub-scan signal transmission lines (odd) are not connected to the even-numbered touch sensor rows 122, the touch sensors constituting the even-numbered touch sensor rows 122 may not generate the sensing signal. Similarly, the second sub-scan signal transmission lines (even) may be connected to the main scan signal transmission lines 140 through the demultiplexing circuit 150, and may receive a scan signal from the scan signal transmission circuit 240 to apply the scan signal to the even-numbered touch sensor rows 122. Since the second sub-scan signal transmission lines (even) are connected to the even-numbered touch sensor rows 122, the second sub-scan signal transmission lines (even) may serve as a driving signal line for applying the scan signal to the even-numbered touch sensor rows 122. That is, the second sub-scan signal transmission lines (even) may apply the scan signal to the even-numbered touch sensor rows 122 connected to the second sub-scan signal transmission lines (even), and the touch sensors constituting the even-numbered touch sensor rows 122 may generate the sensing signal based on the scan signal. On the other hand, since the second sub-scan signal transmission lines (even) are not connected to the odd-numbered touch sensor rows 121, the touch sensors constituting the odd-numbered touch sensor rows 121 may not generate the sensing signal.

The main scan signal transmission lines 140 may extend in the column direction, may be arranged side by side in the row direction, and may be connected to the scan signal transmission circuit 240. The scan signal transmission circuit 240 may apply the scan signal to the main scan signal transmission lines 140 under a control of the control circuit IC. In an embodiment, the scan signal transmission circuit 240 may sequentially apply the scan signal to the main scan signal transmission lines 140. In another embodiment, the scan signal transmission circuit 240 may sequentially apply a scan signal to main scan signal transmission line groups in which at least two or more main scan signal transmission lines 140 are grouped. In addition, the main scan signal transmission lines 140 may be selectively connected to the first sub-scan signal transmission lines (odd) or the second sub-scan signal transmission lines (even) under a control of the demultiplexing circuit 150. Accordingly, the scan signal applied by the scan signal transmission circuit 240 may be applied to the first sub-scan signal transmission line (odd) or the second sub-scan signal transmission line (even) which are connected to the main scan signal transmission line 140 through the main scan signal transmission line 140. For example, when the main scan signal transmission lines 140 and the first sub-scan signal transmission lines (odd) are connected to each other, the scan signal applied by the scan signal transmission circuit 240 may be applied to the first sub-scan signal transmission line (odd) through the main scan signal transmission line 140, and when the main scan signal transmission lines 140 and the second sub-scan signal transmission lines (even) are connected to each other, the scan signal applied by the scan signal transmission circuit 240 may be applied to the second sub-scan signal transmission line (even) through the main scan signal transmission line 140.

The touch panel 10 may include the demultiplexing circuit 150. The demultiplexing circuit 150 may selectively connect the main scan signal transmission lines 140 to the first sub-scan signal transmission lines (odd) or the second sub-scan signal transmission lines (even). According to an embodiment, the demultiplexing circuit 150 may include a plurality of switches, and the switches may be controlled by the control circuit IC. In detail, the demultiplexing circuit 150 may include first switches 151 and second switches 152. The first switches 151 may be located between the main scan signal transmission lines 140 and the first sub-scan signal transmission lines (odd), may be turned on when the first control signal is activated, and may be turned off when the first control signal is deactivated. In this case, activation and deactivation of the first control signal may be controlled by the control circuit IC. Similarly, the second switches 152 may be located between the main scan signal transmission lines 140 and the second sub-scan signal transmission lines (even), may be turned on when the second control signal is activated, and may be turned off when the second control signal is deactivated. In this case, activation and deactivation of the second control signal may be controlled by the control circuit IC. When the first switches 151 are turned on, the scan signal may be applied to the first sub-scan signal transmission lines (odd) connected to the first switches 151, and the scan signal may be applied to the odd-numbered touch sensor rows 121 connected to the first sub-scan signal transmission lines (odd). When the second switches 152 are turned on, the scan signal may be applied to the second sub-scan signal transmission lines (even) connected to the second switches 152, and the scan signal may be applied to the even-numbered touch sensor rows 122 connected to the second sub-scan signal transmission lines (even).

In an embodiment, one frame may include a first sub-frame and a second sub-frame which are sequentially implemented. In other words, one frame may be implemented by implementing the second sub-frame after the first sub-frame is implemented. In this case, the scan signals may be sequentially applied to the main scan signal transmission lines 140 during the first sub-frame, and the scan signals may be sequentially applied to the main scan signal transmission lines 140 during the second sub-frame.

The scan signal transmission circuit 240 may sequentially apply the scan signals to the main scan signal transmission lines 140 during the first sub-frame under the control of the control circuit IC. In this case, since the demultiplexing circuit 150 connects the main scan signal transmission lines 140 to the first sub-scan signal transmission lines (odd) during the first sub-frame, the scan signal may be applied to the first sub-scan signal transmission lines (odd) during the first sub-frame, and the scan signal may be applied only to the odd-numbered touch sensor rows 121 connected to the first sub-scan signal transmission lines (odd). Thereafter, the scan signal transmission circuit 240 may sequentially apply the scan signals to the main scan signal transmission lines 140 during the second sub-frame under the control of the control circuit IC. In this case, since the demultiplexing circuit 150 connects the main scan signal transmission lines 140 to the second sub-scan signal transmission lines (even) during the second sub-frame, the scan signal may be applied to the second sub-scan signal transmission lines (even) during the second sub-frame, and the scan signal may be applied only to the even-numbered touch sensor rows 122 connected to the second sub-scan signal transmission lines (even). According to an embodiment, the scan signal transmission circuit 240 may group the main scan signal transmission lines 140 in a predetermined number (e.g., two each), and may sequentially apply the scan signal to the main scan signal transmission line groups.

Unlike a conventional structure in which the main scan signal transmission lines are connected to all touch sensor columns corresponding to all columns, the touch panel 10 may have a structure in which the main scan signal transmission lines 140 are selectively connected to first sub-scan signal transmission lines (odd) or second sub-scan signal transmission lines (even), and the main scan signal transmission lines 140 may be alternately connected to the odd-numbered touch sensor rows 121 and the even-numbered touch sensor rows 122 for one frame based on above structure. Accordingly, the line resistance of the line through which the scan signal is transmitted may be reduced, and the signal-to-noise ratio of the scan signal may be improved.

Figure 2:
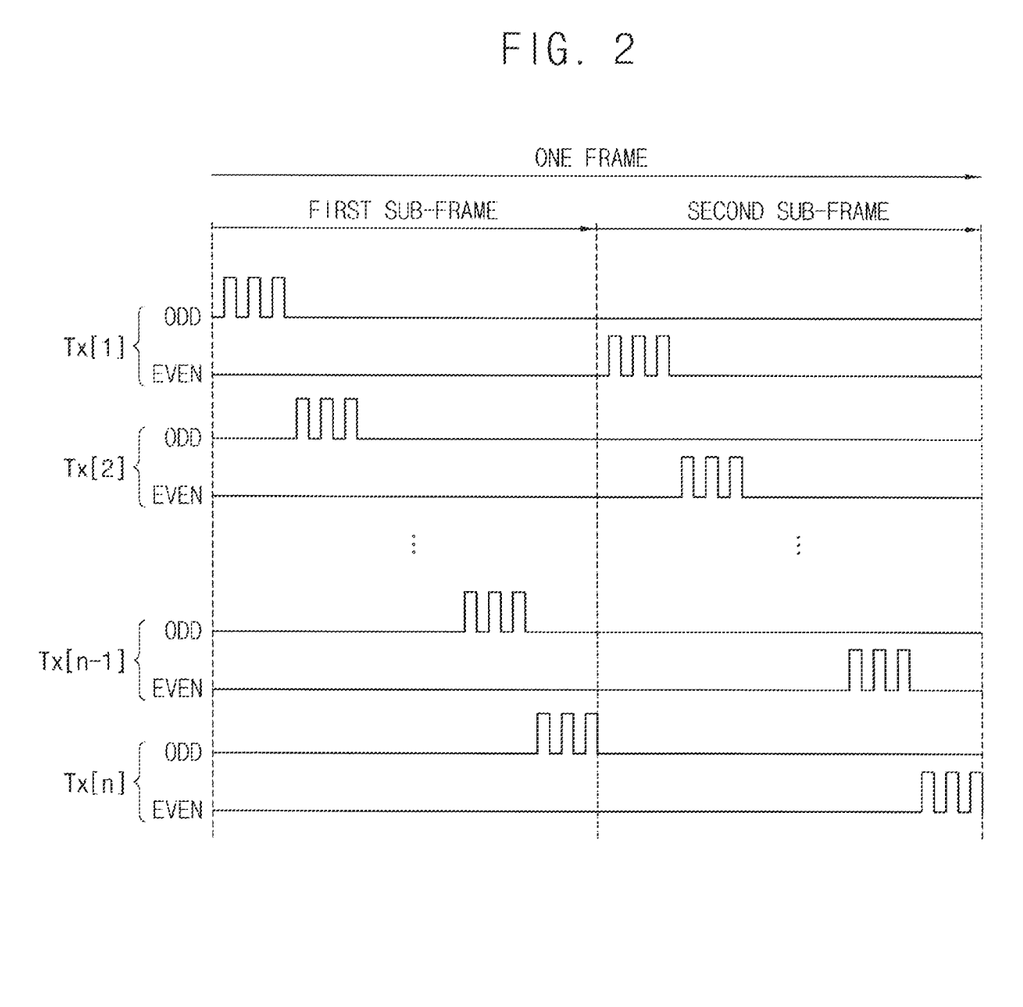
FIG. 2 is a waveform diagram illustrating an example of a scan signal applied to the touch panel of FIG. 1.

The demultiplexing circuit 150 may be controlled by the control circuit IC for one frame. In detail, the demultiplexing circuit 150 may include the first switches 151 and the second switches 152. The first switches 151 may be located between the main scan signal transmission lines 140 and the first sub-scan signal transmission lines (odd), may be turned on when the first control signal applied from the control circuit IC is activated, and may be turned off when the first control signal applied from the control circuit IC is deactivated. Similarly, the second switches 152 may be located between the main scan signal transmission lines 140 and the second sub-scan signal transmission lines (even), may be turned on when the second control signal applied from the control circuit IC is activated, and may be turned off when the second control signal applied from the control circuit IC is deactivated. As shown in FIG. 2, when the first switches 151 are turned on as the first control signal is activated during the first sub-frame, the scan signal is supplied to the first sub-scan signal transmission lines (odd) connected to the first switches 151, and the scan signal may be applied to odd-numbered touch sensor rows 121 connected to the first sub-scan signal transmission lines (odd). In addition, when the second switches 152 are turned on as the second control signal is activated during the second sub-frame, the scan signal is supplied to the second sub-scan signal transmission lines (even) connected to the second switches 152, and the scan signal may be applied to even-numbered touch sensor rows 122 connected to the second sub-scan signal transmission lines (even).

This will be described in detail with reference to FIG. 2.

In another embodiment, one frame may include first to n-th (n is an integer greater than or equal to 3) sub-frames sequentially implemented. In other words, after the first sub-frame is implemented, the second sub-frame may be implemented, and by repeating this to implement the n-th sub-frame, one frame can be implemented. In addition, each of the first to n-th sub-frames may include a first period and a second period following the first period.

The scan signal transmission circuit 240 may sequentially apply the scan signals to the main scan signal transmission lines 140 for one frame under the control of the control circuit IC. In detail, the scan signal may be applied to one main scan signal transmission line among the main scan signal transmission lines 140 during the first sub-frame, and the scan signal may be applied to another main scan signal transmission line adjacent to the one main scan signal transmission line among the main scan signal transmission lines 140 during the second sub-frame following the first sub-frame. By repeating above driving, the scan signals may be sequentially applied to the main scan signal transmission lines 140 over the first to n-th sub-frames.

Since the demultiplexing circuit 150 connects the main scan signal transmission lines 140 to the first sub-scan signal transmission lines (odd) during the first period, the scan signal may be applied to the first sub-scan signal transmission line (odd) during the first period, and the scan signal may be applied only to the odd-numbered touch sensor rows 121 connected to the first sub-scan signal transmission lines (odd). Thereafter, the scan signal transmission circuit 240 may sequentially apply the scan signals to the main scan signal transmission lines 140 during the second period under the control of the control circuit IC. In this case, since the demultiplexing circuit 150 connects the main scan signal transmission lines 140 to the second sub-scan signal transmission lines (even) during the second period, the scan signal may be applied to the second sub-scan signal transmission line (even) during the second period, and the scan signal may be applied only to the even-numbered touch sensor rows 122 connected to the second sub-scan signal transmission lines (even). According to an embodiment, the scan signal transmission circuit 240 may group the main scan signal transmission lines 140 in a predetermined number (e.g., two each), and may sequentially apply the scan signal to the main scan signal transmission line groups.

The demultiplexing circuit 150 may be controlled by the control circuit IC for one frame. In detail, the demultiplexing circuit 150 may include the first switches 151 and the second switches 152. The first switches 151 may be located between the main scan signal transmission lines 140 and the first sub-scan signal transmission lines (odd), may be turned on when the first control signal applied from the control circuit IC is activated, and may be turned off when the first control signal applied from the control circuit IC is deactivated.

Figure 3:
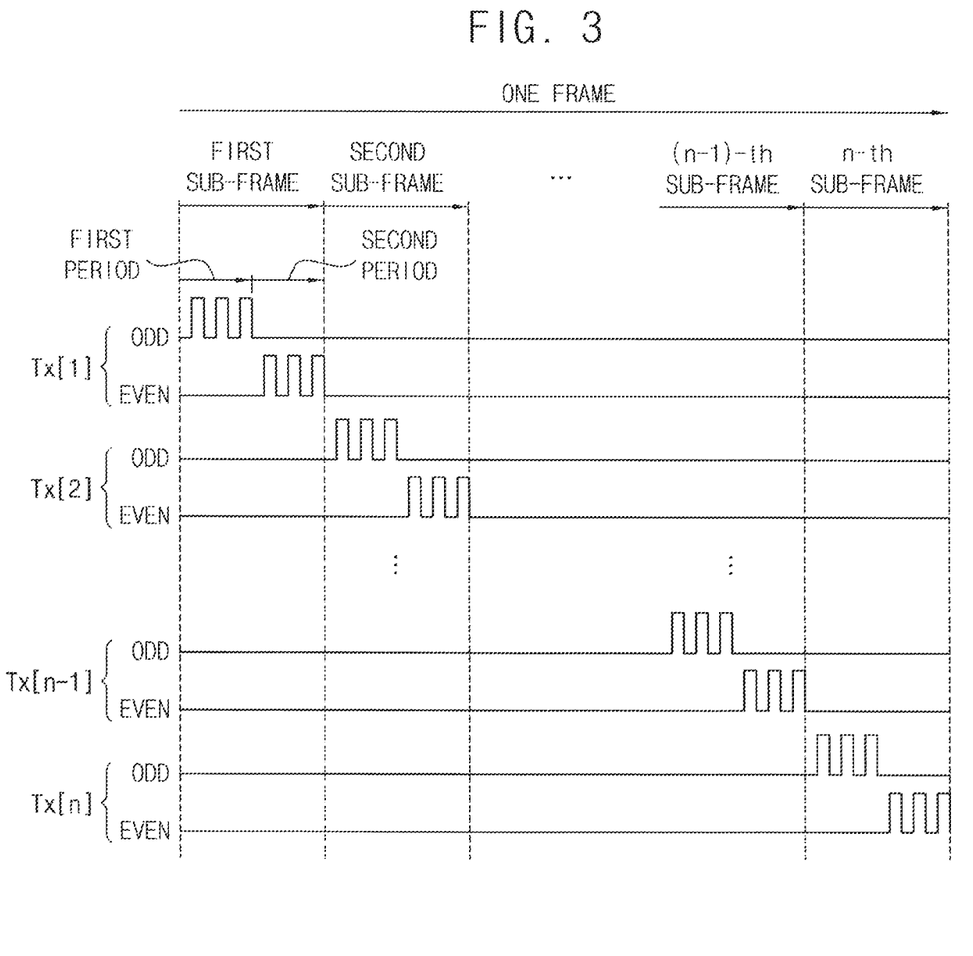
FIG. 3 is a waveform diagram illustrating another example of a scan signal applied to the touch panel of FIG. 1.

Similarly, the second switches 152 may be located between the main scan signal transmission lines 140 and the second sub-scan signal transmission lines (even), may be turned on when the second control signal applied from the control circuit IC is activated, and may be turned off when the second control signal applied from the control circuit IC is deactivated. As shown in FIG. 3, when the first switches 151 are turned on due to the activation of the first control signal during the first period, the scan signal may be applied to the first sub-scan signal transmission lines (odd) connected to the first switches 151, and the scan signal may be applied to odd-numbered touch sensor rows 121 connected to the first sub-scan signal transmission lines (odd). In addition, when the second switches 152 are turned on due to the activation of the second control signal during the second period, the scan signal may be applied to the second sub-scan signal transmission lines (even) connected to the second switches 152, and the scan signal may be applied to even-numbered touch sensor rows 122 connected to the second sub-scan signal transmission lines (even).

This will be described in detail with reference to FIG. 3.

Since the touch panel 10 includes the odd-numbered touch sensor rows 121 corresponding to the odd-numbered rows, the even-numbered touch sensor rows 122 corresponding to the even-numbered rows, the odd-numbered sensing signal transmission lines 131 extending in the row direction, arranged side by side in the column direction, and respectively connected to the odd-numbered touch sensor rows 121, the even-numbered sensing signal transmission lines 132 extending in the row direction, arranged side by side in the column direction, and respectively connected to the even-numbered touch sensor rows 122, the first sub-scan signal transmission lines (odd) extending in the column direction, arranged side by side in the row direction, and connected only to the odd-numbered touch sensor rows 121, the second sub-scan signal transmission lines (even) extending in the column direction, arranged side by side in the row direction, and connected only to the even-numbered touch sensor rows 122, the main scan signal transmission lines 140 extending in the column direction and arranged side by side in the row direction, and the demultiplexing circuit 150 selectively connecting the main scan signal transmission lines 140 to the first sub-scan signal transmission lines (odd) or the second sub-scan signal transmission lines (even), the main scan transmission lines 140 may be alternately connected to odd-numbered touch sensor rows 121 and even-numbered touch sensor rows 122 during one frame. As a result, the touch panel 10 may reduce the line resistance of the line through which the scan signal is transmitted, thereby improving the signal-to-noise ratio of the scan signal. Meanwhile, in the above description, the touch panel 10 has the first and second sub-scan signal transmission lines (odd, even) and the sensing signal transmission lines 131 and 132 orthogonal to each other, and a mutual capacitance method in which the capacitance between the two orthogonal lines is detected is described. But the invention is not limited thereto. According to an embodiment, the touch panel 10 may operate in a self-capacitance method.

FIG. 2 is a waveform diagram illustrating an example of a scan signal applied to the touch panel of FIG. 1.

Referring to FIG. 2, one frame may include the first sub-frame and the second sub-frame which are sequentially implemented. In other words, one frame may be implemented by implementing the second sub-frame after the first sub-frame is implemented. In this case, the scan signals may be sequentially applied to the main scan signal transmission lines 140 or Tx during the first sub-frame, and the scan signals may be sequentially applied to the main scan signal transmission lines 140 or Tx during the second sub-frame.

The scan signal transmission circuit 240 may sequentially apply the scan signals to the main scan signal transmission lines 140 during the first sub-frame under the control of the control circuit IC. In this case, since the demultiplexing circuit 150 connects the main scan signal transmission lines 140 to the first sub-scan signal transmission lines (odd) during the first sub-frame, the scan signal may be applied to the first sub-scan signal transmission lines (odd) during the first sub-frame, and the scan signal may be applied only to the odd-numbered touch sensor rows 121 connected to the first sub-scan signal transmission lines (odd). Thereafter, the scan signal transmission circuit 240 may sequentially apply the scan signals to the main scan signal transmission lines 140 during the second sub-frame under the control of the control circuit IC. In this case, since the demultiplexing circuit 150 connects the main scan signal transmission lines 140 to the second sub-scan signal transmission lines (even) during the second sub-frame, the scan signal may be applied to the second sub-scan signal transmission lines (even) during the second sub-frame, and the scan signal may be applied only to the even-numbered touch sensor rows 122 connected to the second sub-scan signal transmission lines (even). According to an embodiment, the scan signal transmission circuit 240 may group the main scan signal transmission lines 140 in a predetermined number (e.g., two each), and may sequentially apply the scan signal to the main scan signal transmission line groups.

Unlike a conventional structure in which the main scan signal transmission lines are connected to all touch sensor columns corresponding to all columns, the touch panel 10 may have a structure in which the main scan signal transmission lines 140 are selectively connected to first sub-scan signal transmission lines (odd) or second sub-scan signal transmission lines (even), and the main scan transmission lines 140 may be alternately connected to the odd-numbered touch sensor rows 121 and the even-numbered touch sensor rows 122 for one frame based on above structure. Accordingly, the line resistance of the line through which the scan signal is transmitted may be reduced, and the signal-to-noise ratio of the scan signal may be improved.

The demultiplexing circuit 150 may be controlled by the control circuit IC for one frame. In detail, the demultiplexing circuit 150 may include the first switches 151 and the second switches 152. The first switches 151 may be located between the main scan signal transmission lines 140 and the first sub-scan signal transmission lines (odd), may be turned on when the first control signal applied from the control circuit IC is activated, and may be turned off when the first control signal applied from the control circuit IC is deactivated. Similarly, the second switches 152 may be located between the main scan signal transmission lines 140 and the second sub-scan signal transmission lines (even), may be turned on when the second control signal applied from the control circuit IC is activated, and may be turned off when the second control signal applied from the control circuit IC is deactivated. As shown in FIG. 2, when the first switches 151 are turned on as the first control signal is activated during the first sub-frame, the scan signal is supplied to the first sub-scan signal transmission lines (odd) connected to the first switches 151, and the scan signal may be applied to odd-numbered touch sensor rows 121 connected to the first sub-scan signal transmission lines (odd). In addition, when the second switches 152 are turned on as the second control signal is activated during the second sub-frame, the scan signal is supplied to the second sub-scan signal transmission lines (even) connected to the second switches 152, and the scan signal may be applied to even-numbered touch sensor rows 122 connected to the second sub-scan signal transmission lines (even).

FIG. 3 is a waveform diagram illustrating another example of a scan signal applied to the touch panel of FIG. 1.

Referring to FIG. 3, one frame may include first to n-th (n is an integer greater than or equal to 3) sub-frames sequentially implemented. In other words, after the first sub-frame is implemented, the second sub-frame may be implemented, and by repeating this to implement the n-th sub-frame, one frame can be implemented. In addition, each of the first to n-th sub-frames may include the first period and the second period following the first period.

The scan signal transmission circuit 240 may sequentially apply the scan signals to the main scan signal transmission lines 140 for one frame under the control of the control circuit IC. In detail, the scan signal may be applied to one main scan signal transmission line among the main scan signal transmission lines 140 during the first sub-frame, and the scan signal may be applied to another main scan signal transmission line adjacent to the one main scan signal transmission line among the main scan signal transmission lines 140 during the second sub-frame following the first sub-frame. By repeating above driving, the scan signals may be sequentially applied to the main scan signal transmission lines 140 over the first to n-th sub-frames.

Since the demultiplexing circuit 150 connects the main scan signal transmission lines 140 to the first sub-scan signal transmission lines (odd) during the first period, the scan signal may be applied to the first sub-scan signal transmission line (odd) during the first period, and the scan signal may be applied only to the odd-numbered touch sensor rows 121 connected to the first sub-scan signal transmission lines (odd). Thereafter, the scan signal transmission circuit 240 may sequentially apply the scan signals to the main scan signal transmission lines 140 during the second period under the control of the control circuit IC. In this case, since the demultiplexing circuit 150 connects the main scan signal transmission lines 140 to the second sub-scan signal transmission lines (even) during the second period, the scan signal may be applied to the second sub-scan signal transmission line (even) during the second period, and the scan signal may be applied only to the even-numbered touch sensor rows 122 connected to the second sub-scan signal transmission lines (even). According to an embodiment, the scan signal transmission circuit 240 may group the main scan signal transmission lines 140 in a predetermined number (e.g., two each), and may sequentially apply the scan signal to the main scan signal transmission line groups.

The demultiplexing circuit 150 may be controlled by the control circuit IC for one frame. In detail, the demultiplexing circuit 150 may include the first switches 151 and the second switches 152. The first switches 151 may be located between the main scan signal transmission lines 140 and the first sub-scan signal transmission lines (odd), may be turned on when the first control signal applied from the control circuit IC is activated, and may be turned off when the first control signal applied from the control circuit IC is deactivated. Similarly, the second switches 152 may be located between the main scan signal transmission lines 140 and the second sub-scan signal transmission lines (even), may be turned on when the second control signal applied from the control circuit IC is activated, and may be turned off when the second control signal applied from the control circuit IC is deactivated. As shown in FIG. 3, when the first switches 151 are turned on due to the activation of the first control signal during the first period, the scan signal may be applied to the first sub-scan signal transmission lines (odd) connected to the first switches 151, and the scan signal may be applied to odd-numbered touch sensor rows 121 connected to the first sub-scan signal transmission lines (odd). In addition, when the second switches 152 are turned on due to the activation of the second control signal during the second period, the scan signal may be applied to the second sub-scan signal transmission lines (even) connected to the second switches 152, and the scan signal may be applied to even-numbered touch sensor rows 122 connected to the second sub-scan signal transmission lines (even).

Figure 4:
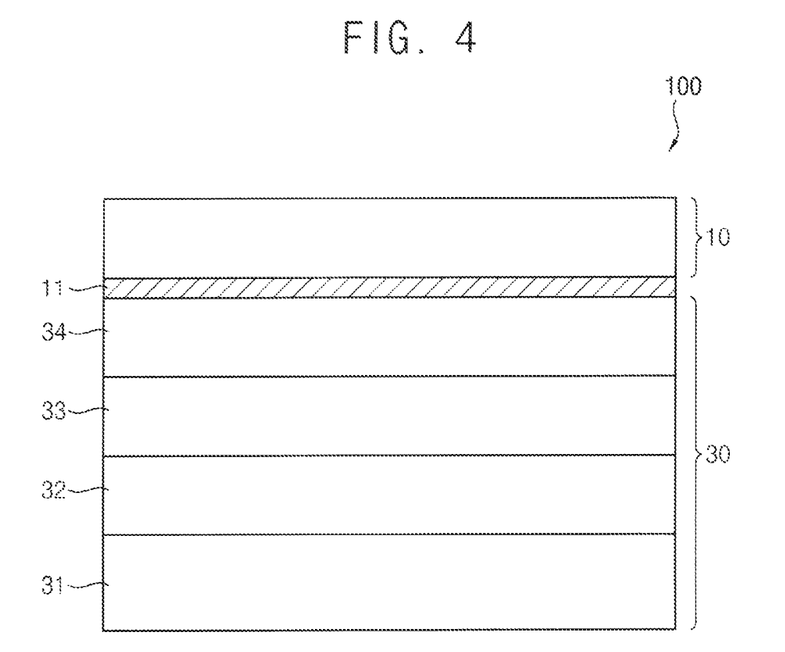
FIG. 4 is a diagram illustrating a display device including the touch panel of FIG. 1.
Figure 5:
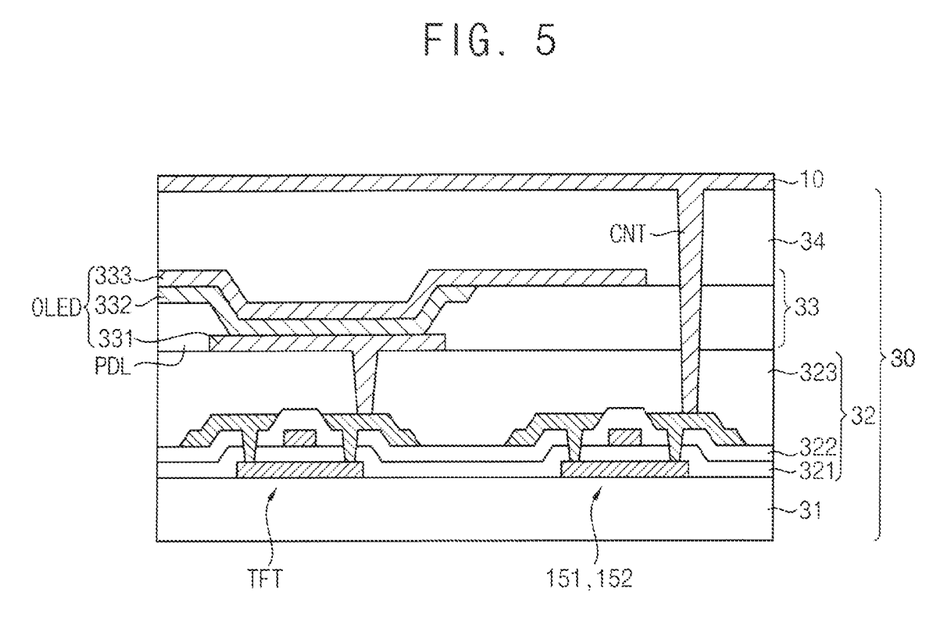
FIG. 5 is a diagram illustrating a demultiplexing unit included in the touch panel of FIG. 1.

FIG. 4 is a diagram illustrating a display device including the touch panel of FIG. 1, and FIG. 5 is a diagram illustrating a demultiplexing unit included in the touch panel of FIG. 1.

Referring to FIGS. 4 and 5, a display device 100 may include the touch panel 10 and a display panel 30.

The touch panel 10 may detect a touch position using the touch sensors included in a touch sensor layer 11. In this case, the touch sensor layer 11 may be disposed on a thin film encapsulation layer 34 included in the display panel 30. In other words, the touch sensors included in the touch panel 10 may be disposed on the thin film encapsulation layer 34 included in the display panel 30. As described above, the touch panel 10 may include the odd-numbered touch sensor rows 121 corresponding to the odd-numbered rows, the even-numbered touch sensor rows 122 corresponding to the even-numbered rows, the odd-numbered sensing signal transmission lines 131 extending in the row direction, arranged side by side in the column direction, and respectively connected to the odd-numbered touch sensor rows 121, the even-numbered sensing signal transmission lines 132 extending in the row direction, arranged side by side in the column direction, and respectively connected to the even-numbered touch sensor rows 122, the first sub-scan signal transmission lines (odd) extending in the column direction, arranged side by side in the row direction, and connected only to the odd-numbered touch sensor rows 121, the second sub-scan signal transmission lines (even) extending in the column direction, arranged side by side in the row direction, and connected only to the even-numbered touch sensor rows 122, the main scan signal transmission lines 140 extending in the column direction and arranged side by side in the row direction, and the demultiplexing circuit 150 selectively connecting the main scan signal transmission lines 140 to the first sub-scan signal transmission lines (odd) or the second sub-scan signal transmission lines (even). However, since the touch panel 10 has been described above, a redundant description thereof will be omitted.

The display panel 30 may include a substrate 31, a transistor layer 32 including at least one transistor TFT, 151, and 152 which are disposed on the substrate 31, an emission layer 33 disposed on the transistor layer 32 and including an emitting diode (e.g., organic light emitting diode "OLED", etc), and the thin film encapsulation layer 34 disposed on the emission layer 33 to cover the emitting diode (OLED). The 31 may support various components of the display panel 30. The substrate 31 may be made of a transparent or opaque material (e.g., glass or plastic). For example, the substrate 31 may include a polyimide material. The transistor layer 32 may include transistors TFT, 151, and 152. In this case, the transistor layer 32 may include a planarization layer 323 for planarizing upper portions of the transistors TFT, 151, and 152. For example, the planarization layer 323 may be formed of an organic insulating material (e.g., acrylic resin, etc.). In one embodiment, as shown in FIG. 5, the first switches 151 and the second switches 152 included in the demultiplexing circuit 150 may be formed on the transistor layer 32. For example, the first switches 151 and the second switches 152 included in the demultiplexing circuit 150 may be formed on the substrate 31 included in the display panel 30, and may be formed together with the transistor TFT constituting a pixel of the display panel 30. For convenience of explanation, in FIG. 5, the transistor layer 32 is illustrated as including only the driving transistor TFT as the transistor TFT constituting the pixel, but it is apparent that the transistor layer 32 may further include other transistors constituting the pixel, a power supply line, a signal line, a capacitor, and the like.

The emission layer 33 may include an organic light emitting diode OLED and a pixel defining layer PDL. The organic light emitting diode OLED may include a first electrode 331, an organic layer 332, and a second electrode 333. In detail, the first electrode 331 may be disposed on the planarization layer 323 and may be electrically connected to the transistor TFT through a contact hole of the planarization layer 323. The organic layer 332 may be disposed on the first electrode 331. For example, the organic layer 332 may have a structure in which a hole injection layer, a hole transport layer, an organic emission layer, an electron transport layer, and an electron injection layer are sequentially stacked. The pixel defining layer PDL may be disposed to cover both ends of the first electrode 331. The pixel defining layer PDL may define an emission area of the pixel. The second electrode 333 may be disposed on the organic layer 332. The thin film encapsulation layer 34 may be disposed on the emission layer 33. The thin film encapsulation layer 34 may be formed on the organic light emitting diode OLED to protect the organic light emitting diode OLED from penetration of moisture or oxygen. The thin film encapsulation layer 34 may be formed of an inorganic layer, or may have a structure in which inorganic layers and organic layers are alternately stacked.

As described above, the touch sensors included in the touch panel 10 may be directly formed on the thin film encapsulation layer 34 of the display panel 30. That is, the touch panel 10 may have an on-cell structure in which touch sensors are integrated on the display panel 30. In detail, the on-cell structure may be implemented by embedding odd-numbered touch sensor rows 121 and/or even-numbered touch sensor rows 122 on the thin film encapsulation layer 34. Accordingly, the display device 100 in which the touch panel 10 and the display panel 30 may be provided. Meanwhile, according to an embodiment, the touch panel 10 may have an in-cell structure in which the touch sensors included in the touch panel 10 are disposed inside the display panel 30. When the touch panel 10 has an in-cell structure, the touch sensors may be formed inside the display panel 30, and the touch electrodes included in the touch sensor may be operated as the first electrode 331 or the second electrode 333 of the organic light emitting diode OLED. The thickness of the display device 100 may be minimized by configuring the touch sensors to be integrated onto or inside the display panel 30, and thus, the flexible display device 100 may be implemented. In an embodiment, the demultiplexing circuit 150 may be formed in the transistor layer 32. The demultiplexing circuit 150 may selectively connect the main scan signal transmission lines 140 to the first sub-scan signal transmission lines (odd) or the second sub-scan signal transmission lines (even). In an embodiment, the demultiplexing circuit 150 may include first switches 151 and second switches 152. Referring to FIG. 5, the first switches 151 and/or the second switches 152 may be formed in the transistor layer 32. In this case, the touch panel 10 disposed on the thin film encapsulation layer 34 may be connected to the first switches 151 and/or the second switches 152 through a separate contact hole CNT. By forming the first switches 151 and/or the second switches 152 in the transistor layer 32, the transistor TFT, the first switches 151, and/or the second switches 152 may be formed together, and it is possible to achieve convenience in the process of manufacturing the display device 100.

The present invention may be applied to an electronic device including a touch panel. For example, the present invention may be applied to a computer, a notebook, a mobile phone, a smartphone, a smart pad, a PMP, a PDA, an MP3 player, or the like.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

The invention claimed is:

1. A touch panel comprising:
    odd-numbered touch sensor rows corresponding to odd-numbered rows;
    even-numbered touch sensor rows corresponding to even-numbered rows;
    odd-numbered sensing signal transmission lines extending in a row direction, arranged side by side in a column direction, and respectively connected to the odd-numbered touch sensor rows;
    even-numbered sensing signal transmission lines extending in the row direction, arranged side by side in the column direction, and respectively connected to the even-numbered touch sensor rows;
    first sub-scan signal transmission lines extending in the column direction, arranged side by side in the row direction, and connected only to the odd-numbered touch sensor rows;
    second sub-scan signal transmission lines extending in the column direction, arranged side by side in the row direction, and connected only to the even-numbered touch sensor rows;
    main scan signal transmission lines extending in the column direction and arranged side by side in the row direction; and
    a demultiplexing circuit configured to selectively connect the main scan signal transmission lines to the first sub-scan signal transmission lines or the second sub-scan signal transmission lines,
    one frame includes a first sub-frame and a second sub-frame which are sequentially implemented,
    wherein the demultiplexing circuit is configured to connect the main scan signal transmission lines to the first sub-scan signal transmission lines during the first sub-frame, and
    wherein the demultiplexing circuit is configured to connect the main scan signal transmission lines to the second sub-scan signal transmission lines during the second sub-frame.

2. The touch panel of claim 1, wherein the demultiplexing circuit comprises:
    first switches located between the main scan signal transmission lines and the first sub-scan signal transmission lines, configured to turn on when a first control signal is activated, and configured to turn off when the first control signal is deactivated; and second switches located between the main scan signal transmission lines and the second sub-scan signal transmission lines, configured to turn on when a second control signal is activated, and configured to turn off when the second control signal is deactivated.

3. The touch panel of claim 2, one frame includes first to n-th sub-frames sequentially implemented, and
wherein each of the first to n-th sub-frames includes a first period and a second period following the first period, where n is an integer greater than or equal to 3.

4. The touch panel of claim 1, wherein the first control signal is configured to be activated and the second control signal is configured to be deactivated in the first sub-frame, and
wherein the first control signal is configured to be deactivated and the second control signal is configured to be activated in the second sub-frame.

5. A touch panel comprising:
odd-numbered touch sensor rows corresponding to odd-numbered rows;
even-numbered touch sensor rows corresponding to even-numbered rows;
odd-numbered sensing signal transmission lines extending in a row direction, arranged side by side in a column direction, and respectively connected to the odd-numbered touch sensor rows;
even-numbered sensing signal transmission lines extending in the row direction, arranged side by side in the column direction, and respectively connected to the even-numbered touch sensor rows;
first sub-scan signal transmission lines extending in the column direction, arranged side by side in the row direction, and connected only to the odd-numbered touch sensor rows;
second sub-scan signal transmission lines extending in the column direction, arranged side by side in the row direction, and connected only to the even-numbered touch sensor rows;
main scan signal transmission lines extending in the column direction and arranged side by side in the row direction; and
a demultiplexing circuit configured to selectively connect the main scan signal transmission lines to the first sub-scan signal transmission lines or the second sub-scan signal transmission lines,
wherein the demultiplexing circuit comprises:
first switches located between the main scan signal transmission lines and the first sub-scan signal transmission lines, configured to turn on when a first control signal is activated, and configured to turn off when the first control signal is deactivated; and
second switches located between the main scan signal transmission lines and the second sub-scan signal transmission lines, configured to turn on when a second control signal is activated, and configured to turn off when the second control signal is deactivated,
one frame includes first to n-th sub-frames sequentially implemented, and
wherein each of the first to n-th sub-frames includes a first period and a second period following the first period, where n is an integer greater than or equal to 3,
wherein the demultiplexing circuit is configured to connect the main scan signal transmission lines to the first sub-scan signal transmission lines during the first period, and
wherein the demultiplexing circuit is configured to connect the main scan signal transmission lines to the second sub-scan signal transmission lines during the second period.

6. The touch panel of claim 5, wherein the first control signal is configured to be activated and the second control signal is configured to be deactivated in the first period, and
wherein the first control signal is configured to be deactivated and the second control signal is configured to be activated in the second period.

7. A touch panel comprising:
odd-numbered touch sensor rows corresponding to odd-numbered rows;
even-numbered touch sensor rows corresponding to even-numbered rows;
odd-numbered sensing signal transmission lines extending in a row direction, arranged side by side in a column direction, and respectively connected to the odd-numbered touch sensor rows;
even-numbered sensing signal transmission lines extending in the row direction, arranged side by side in the column direction, and respectively connected to the even-numbered touch sensor rows;
first sub-scan signal transmission lines extending in the column direction, arranged side by side in the row direction, and connected only to the odd-numbered touch sensor rows;
second sub-scan signal transmission lines extending in the column direction, arranged side by side in the row direction, and connected only to the even-numbered touch sensor rows;
main scan signal transmission lines extending in the column direction and arranged side by side in the row direction; and
a demultiplexing circuit configured to selectively connect the main scan signal transmission lines to the first sub-scan signal transmission lines or the second sub-scan signal transmission lines,
a scan signal transmission circuit connected to the main scan signal transmission lines and configured to sequentially transmit scan signals to the main scan signal transmission lines;
a sensing signal receiving circuit connected to the odd-numbered sensing signal transmission lines and the even-numbered sensing signal transmission lines and configured to receive sensing signals corresponding to the scan signals from the odd-numbered sensing signal transmission lines and the even-numbered sensing signal transmission lines; and
a control circuit configured to detect a touch position based on the sensing signals and configured to control the scan signal transmission circuit, the sensing signal receiving circuit, and the demultiplexing circuit.

8. A display device comprising:
a display panel configured to display images; and
a touch panel including a plurality of touch sensors disposed on a thin film encapsulation layer included in the display panel and configured to detect a touch position using the touch sensors,
wherein the touch panel comprises:
odd-numbered touch sensor rows corresponding to odd-numbered rows;
even-numbered touch sensor rows corresponding to even-numbered rows;

odd-numbered sensing signal transmission lines extending in a row direction, arranged side by side in a column direction, and respectively connected to the odd-numbered touch sensor rows;

even-numbered sensing signal transmission lines extending in the row direction, arranged side by side in the column direction, and respectively connected to the even-numbered touch sensor rows;

first sub-scan signal transmission lines extending in the column direction, arranged side by side in the row direction, and connected only to the odd-numbered touch sensor rows;

second sub-scan signal transmission lines extending in the column direction, arranged side by side in the row direction, and connected only to the even-numbered touch sensor rows;

main scan signal transmission lines extending in the column direction and arranged side by side in the row direction; and a demultiplexing circuit configured to selectively connect the main scan signal transmission lines to the first sub-scan signal transmission lines or the second sub-scan signal transmission lines, wherein the touch panel further comprises:
   a scan signal transmission circuit connected to the main scan signal transmission lines and configure to sequentially transmit scan signals to the main scan signal transmission lines;
   a sensing signal receiving circuit connected to the odd-numbered sensing signal transmission lines and the even-numbered sensing signal transmission lines and configured to receive sensing signals corresponding to the scan signals from the odd-numbered sensing signal transmission lines and the even-numbered sensing signal transmission lines; and
   a control circuit configured to detect a touch position based on the sensing signals and configured to control the scan signal transmission circuit, the sensing signal receiving circuit, and the demultiplexing circuit.

9. The display device of claim 8, wherein the display panel comprises:
   a substrate;
   a transistor layer disposed on the substrate and including at least one transistor;
   an emission layer disposed on the transistor layer and including at least one emitting diode; and
   the thin film encapsulation layer disposed on the emission layer and covering the emitting diode.

10. The display device of claim 9, wherein the demultiplexing circuit is formed in the transistor layer.

11. The display device of claim 8, wherein the demultiplexing circuit comprises:
   first switches located between the main scan signal transmission lines and the first sub-scan signal transmission lines, configured to turn on when a first control signal is activated, and configured to turn off when the first control signal is deactivated; and
   second switches located between the main scan signal transmission lines and the second sub-scan signal transmission lines, configured to turn on when a second control signal is activated, and configured to turn off when the second control signal is deactivated.

12. The display device of claim 11, one frame includes a first sub-frame and a second sub-frame which are sequentially implemented.

13. The display device of claim 12, wherein the demultiplexing circuit is configured to connect the main scan signal transmission lines to the first sub-scan signal transmission lines during the first sub-frame, and
   wherein the demultiplexing circuit is configured to connect the main scan signal transmission lines to the second sub-scan signal transmission lines during the second sub-frame.

14. The display device of claim 13, wherein the first control signal is configured to be activated and the second control signal is configured to be deactivated in the first sub-frame, and
   wherein the first control signal is configured to be deactivated and the second control signal is configured to be activated in the second sub-frame.

15. The display device of claim 11, one frame includes first to n-th sub-frames sequentially implemented, and
   wherein each of the first to n-th sub-frames includes a first period and a second period following the first period, where n is an integer greater than or equal to 3.

16. The display device of claim 15, wherein the demultiplexing circuit is configured to connect the main scan signal transmission lines to the first sub-scan signal transmission lines during the first period, and
   wherein the demultiplexing circuit is configured to connect the main scan signal transmission lines to the second sub-scan signal transmission lines during the second period.

17. The display device of claim 16, wherein the first control signal is configured to be activated and the second control signal is configured to be deactivated in the first period, and
   wherein the first control signal is configured to be deactivated and the second control signal is configured to be activated in the second period.

* * * * *